(12) United States Patent
Chyi et al.

(10) Patent No.: US 9,093,510 B2
(45) Date of Patent: Jul. 28, 2015

(54) FIELD EFFECT TRANSISTOR DEVICE

(71) Applicants: National Central University, Jhongli, Taoyuan County (TW); Delta Electronics, Inc., Taoyuan Hsien (TW)

(72) Inventors: Jen-Inn Chyi, Jhongli (TW); Hui-Ling Lin, Jhongli (TW); Geng-Yen Lee, Jhongli (TW); Shih-Peng Chen, Taoyuan Hsien (TW)

(73) Assignees: NATIONAL CENTRAL UNIVERSITY, Taoyuan (TW); DELTA ELECTRONICS, INC., Taoyuan (TW)

( * ) Notice: Subject to any disclaimer, the term of this patent is extended or adjusted under 35 U.S.C. 154(b) by 2 days.

(21) Appl. No.: 13/962,344

(22) Filed: Aug. 8, 2013

(65) Prior Publication Data

US 2014/0042455 A1 Feb. 13, 2014

Related U.S. Application Data

(60) Provisional application No. 61/681,533, filed on Aug. 9, 2012.

(51) Int. Cl.
| | |
|---|---|
| *H01L 29/778* | (2006.01) |
| *H01L 29/66* | (2006.01) |
| *H01L 29/423* | (2006.01) |
| *H01L 29/51* | (2006.01) |
| *H01L 29/20* | (2006.01) |
| *H01L 29/205* | (2006.01) |

(52) U.S. Cl.
CPC ........ *H01L 29/778* (2013.01); *H01L 29/66462* (2013.01); *H01L 29/7786* (2013.01); *H01L 29/2003* (2013.01); *H01L 29/205* (2013.01); *H01L 29/4236* (2013.01); *H01L 29/517* (2013.01)

(58) Field of Classification Search
CPC . H01L 29/778; H01L 29/66; H01L 29/66462; H01L 29/7786; H01L 29/4236; H01L 29/517; H01L 29/2003; H01L 29/205
USPC ............ 257/76, 190, 194, E21.407, E29.246, 257/E29.247, E29.25, E29.253
See application file for complete search history.

(56) References Cited

U.S. PATENT DOCUMENTS

| | | | | |
|---|---|---|---|---|
| 2002/0167023 | A1* | 11/2002 | Chavarkar et al. | 257/194 |
| 2007/0131970 | A1* | 6/2007 | Mittereder et al. | 257/194 |
| 2010/0270534 | A1* | 10/2010 | Pioro-Ladriere et al. | 257/14 |
| 2011/0193619 | A1* | 8/2011 | Parikh et al. | 327/534 |
| 2013/0271208 | A1* | 10/2013 | Then et al. | 327/541 |

* cited by examiner

*Primary Examiner* — Selim Ahmed
(74) *Attorney, Agent, or Firm* — Muncy, Geissler, Olds & Lowe, P.C.

(57) ABSTRACT

A field effect transistor device is provided by the invention. The field effect transistor device includes: a substrate; a buffer layer, a channel layer, and a first barrier layer sequentially disposed on the substrate; a two-dimensional electron gas controlling layer disposed on the first barrier layer; a second barrier layer disposed on the two-dimensional electron gas controlling layer, wherein the second barrier layer has a recess passing through the second barrier layer; and a gate electrode filled into the recess and separated from the second barrier layer and the two-dimensional electron gas controlling layer by an insulating layer.

20 Claims, 13 Drawing Sheets

FIELD EFFECT TRANSISTOR DEVICE

CROSS-REFERENCE TO RELATED APPLICATIONS

This application claims the benefit of U.S. Provisional Application No. 61/681,533, filed Aug. 9, 2012, the entirety of which is incorporated by reference herein.

BACKGROUND OF THE INVENTION

1. Field of the Invention

The present invention relates to a field effect transistor device, and in particularly to a heterojunction field effect transistor device which is normally-off.

2. Description of the Related Art

A nitride semiconductor has a high electric breakdown field and a high electron saturation velocity. Thus, the nitride semiconductor is expected to be a semiconductor material for semiconductor devices having a high breakdown voltage and a low on-state resistance. Many of the conventional semiconductor devices using the nitride related materials may have heterojunctions. The heterojunction is configured with two types of nitride semiconductors having different bandgap energies from each other and is able to generate a two-dimensional electron gas layer (2DEG layer) near the junction plane. The semiconductor devices having the heterojunction may achieve a low on-state resistance by passing an electric current through this 2DEG layer. These types of semiconductor devices are called high electron mobility transistors (HEMT).

This type of conventional semiconductor device has a gate portion for switching the electric current. The gate portion has a heterojunction and a gate electrode that faces the heterojunction. A 2DEG layer may be generated near the heterojunction plane with high density. This type of conventional semiconductor device utilizes the 2DEG layer generated near the heterojunction plane as a channel, and as a result, achieves a low on-state resistance. This type of conventional semiconductor device operates in a normally-on mode since there is a source-drain flow of electrons when no voltage is applied to the gate. To turn off the normally-on mode HEMT, a negative voltage is required in order to eliminate the 2DEG layer under the gate electrode. Use of such a negative power supply made the associated circuitry unnecessarily complex and expensive. The conventional normally-on HEMTs are rather inconvenient to use.

Attempts have been made to render the HEMT normally-off. For example, including: partly removing the electron supply layer to expose a part of the electron transit layer and place the gate on the exposed part of the electron transit layer via an insulating film (i.e. gate recess process). However, creating the recess in the electron supply layer leads to shortcomings wherein the threshold voltage changes substantially with manufacturing errors in the depth of the recess in the electron supply layer, and thus the transistor does not have a uniform threshold voltage and has low reliability due to the poor etching tolerance between the electron supply layer and a layer underlying the electron supply layer.

Therefore, a novel field effect transistor device which overcomes the above difficulties and inconveniences is desired

BRIEF SUMMARY OF THE INVENTION

Accordingly, a normally-off field effect transistor device (such as a normally-off heterojunction field effect transistor) with a uniform threshold voltage and a high reliability is provided.

An exemplary field effect transistor device (such as a heterojunction field effect transistor) includes: a substrate; a buffer layer, a channel layer, and a first barrier layer sequentially disposed on the substrate; a two-dimensional electron gas controlling layer disposed on the first barrier layer; a second barrier layer disposed on the two-dimensional electron gas controlling layer, wherein the second barrier layer has a recess passing through the second barrier layer; and a gate electrode filled into the recess and separated from the second barrier layer and the two-dimensional electron gas controlling layer by an insulating layer. It should be noted that, in order for the field effect transistor to be capable of operating as a normally-off switch, the two-dimensional electron gas controlling layer must have enough thickness, such as more than or equal to 5 nm, to prevent two-dimensional electron gases to be generated at the two-dimensional electron controlling layer directly under the gate electrode.

The invention also provides a method for manufacturing the aforementioned field effect transistor device, including: providing a substrate; sequentially forming a buffer layer, a channel layer, and a first barrier layer sequentially on the substrate; forming a two-dimensional electron gas controlling layer on the first barrier layer, wherein the two-dimensional electron gas controlling layer has a thickness of more than or equal to 5 nm; forming a second barrier layer on the two-dimensional electron gas controlling layer; patterning the second barrier layer to form a recess passing through the second barrier layer; and forming an insulating layer to cover sidewalls and a bottom surface of the recess, and filling a gate electrode into the recess.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
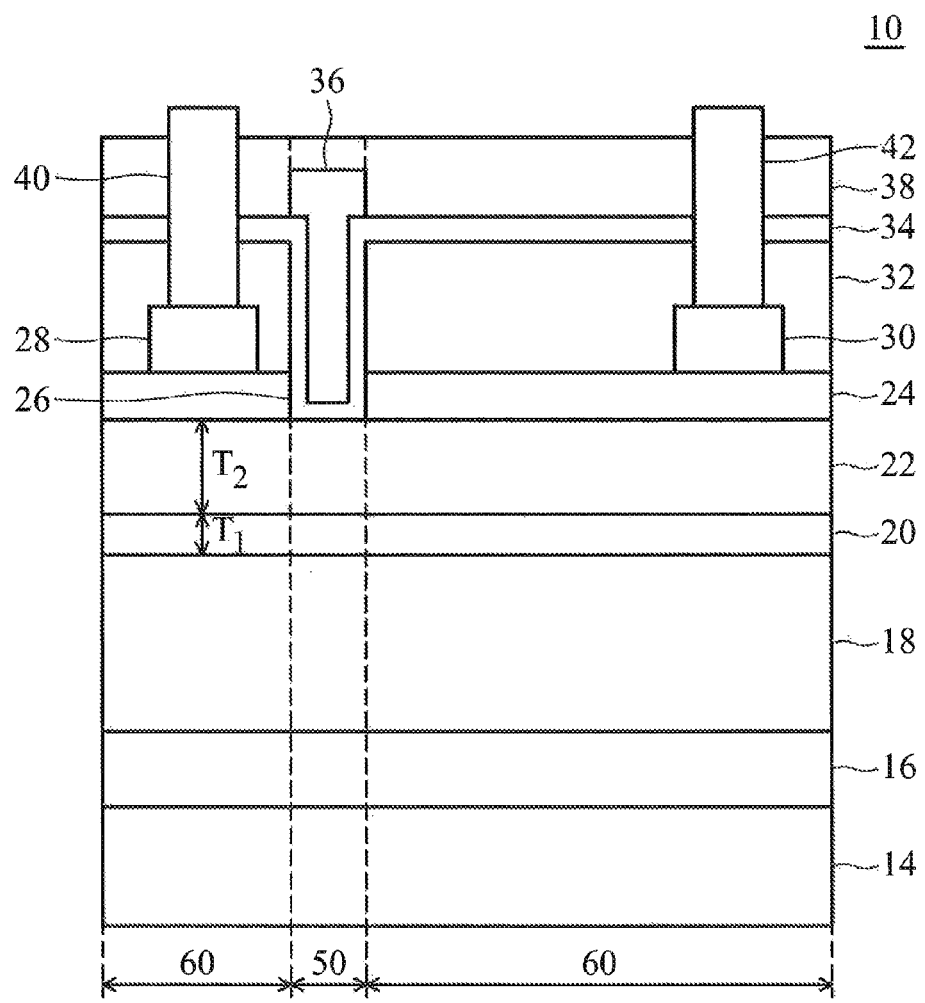
FIG. 1 is a cross-section showing a field effect transistor device according to an embodiment of the invention.

In FIG. 1, an exemplary field effect transistor device 10 (such as a heterojunction field effect transistor) is illustrated, including a substrate 14. The substrate 14 can be silicon carbide, sapphire; silicon, aluminum nitride, gallium nitride or zinc oxide. Although not shown in the FIG. 1, a transition layer or a nucleation layer can be formed on the substrate to facilitate the growth of semiconductor layers. The nucleation layer is specific to the type of substrate used.

A buffer layer 16, a channel layer 18, and a first barrier layer 20 are sequentially disposed on the substrate 12. The buffer layer 16 generally provides a more uniform crystal structure for epitaxial deposition than normal, and thus can be optionally included for improved device characteristics. The buffer layer 16 can be a single layer such as an aluminum nitride layer, or can be a composite layer such as a combination of aluminum gallium nitride and aluminum nitride layer. The channel layer 18 comprises GaN or AlGaN. It is noted that the buffer layer 16 and the channel layer 18 both have a wide range in thickness and can be designed according to product requirement. In an embodiment of the invention, the buffer layer 16 is made of AlN and has a thickness of 500 nm. The channel layer 18 is made of $Al_xGa_{(1-x)}N$ ($0 \le x \le 0.5$) and have a thickness of 500 nm. The first barrier layer 20 comprises materials having a larger band gap than the channel layer 18, in order to reduce the resistance of the channel layer 18. For example, the first barrier layer 20 can be made of $Al_yGa_{(1-y)}N$ ($0.05 \le y \le 0.5$), and it should be noted that y has to be larger than x for ensuring that the first barrier layer 20 has a larger band p than that of the channel layer 18. The thickness $T_1$ of the first barrier layer 20 can be of between 1-10 nm, such as 5 nm. If the thickness $T_1$ is less than 1 nm, the first barrier layer would not exhibit the barrier properties thereof, resulting in the field effect transistor device 10 not having a double-channel configuration. On the other hand, if the thickness $T_1$ is more than 10 nm, a thickness $T_2$ of a subsequently formed two-dimensional electron gas controlling layer 22 would also be increased, thereby narrowing the process window and increasing the process complexity.

A two-dimensional electron gas controlling layer 22 is formed on the first barrier layer 20. In the invention, the two-dimensional electron gas controlling layer 22 is used to increase the energy band for conduction band $E_C$ electrons within a gate-located region 50 (as shown in FIG. 1). Therefore, the field effect transistor device 10 as shown in FIG. 1 is capable of operating as a normally-off switch and has a double-channel configuration. It should be noted that, in order to perform the above functions, the two-dimensional electron gas controlling layer 22 must have enough thickness. Typically, a thickness $T_2$ of the two-dimensional electron gas controlling layer 22 is more than or equal to 5 nm. For example, the thickness $T_2$ of the two-dimensional electron gas controlling layer 22 can be of between 5-1000 nm, such as 5-100 nm, 5-200 nm, 5-300 nm, 5-400 nm, or 5-500 nm. If the thickness $T_2$ is less than 5 nm, the dimensional electron gas controlling layer 22 within the gate-located region 50 would have a two-dimensional electron gas concentration, resulting in the field, effect transistor device 10 not being capable of operating as a normally-off switch, On the other hand, if the thickness $T_2$ is more than 1000 nm, the channel layer 18 of the field effect transistor device 10 would have a relatively low or zero two-dimensional electron gas concentration, resulting in the field effect transistor device 10 not having a double-channel configuration. According to an embodiment of the invention, the two-dimensional electron gas controlling layer can be made of $Al_zGa_{(1-z)}N$, and z is of between 0-0.5, wherein y is larger than z.

A second barrier layer 24 with a recess 26 is formed on the two-dimensional electron gas controlling layer 22, wherein the recess 26 is located in the gate-located region 50 and a gate structure (including an insulating layer and a gate electrode) is disposed therein. The thickness of the second barrier layer 24 can be decided according to user-specific needs, such as 1-100 nm. According to an embodiment of the invention, the second barrier layer 24 can be made of $Al_hIn_{(1-h)}N$, and h is of between 0.8-1. Due to the high aluminum content, the second barrier 24 promotes the conduction band $E_C$ electrons of the layer (two-dimensional electron gas controlling layer 22) within, a access region 60 to cross the Fermi level $E_F$, thereby increasing the two-dimensional electron gas concentration of the layer (two-dimensional electron gas controlling layer) within a access region 60. In addition, the second barrier layer 24 can be etched by an alkaline solution (such as a KOH aqueous solution). Particularly, when the two-dimensional electron gas controlling layer is made of GaN (i.e. z is 0), the recess 26 can be formed by removing the second barrier layer 24 within the gate-located region 50 via wet-etching with the two-dimensional electron gas controlling layer 22 serving as an etching stop layer. Therefore, the recess 26 exposes a top surface of the two-dimensional electron gas controlling layer 22. Since aluminum indium nitride has high spontaneous polarization, the second barrier layer 24 made of aluminum indium nitride can be capable to prevent electrons from escaping from the two-dimensional electron gas controlling layer 22, thereby forcing the two-dimensional electron gas controlling layer 22 to function as a second channel (the channel layer is the first channel). It should be noted that the channel layer 18 has a first two-dimensional electron gas concentration and the two-dimensional electron gas controlling layer has a second two-dimensional electron gas concentration, wherein the second two-dimensional electron gas concentration is larger than the first two-dimensional electron gas concentration. According to another embodiment of the invention, the second barrier layer has an energy gap larger than the channel layer in order to confine two-dimensional electron gas in between the second barrier layer 24 and the channel layer 20. According to another embodiment of the invention, an AlN layer (not shown) can be formed between the two-dimensional electron gas controlling layer 22 and the second. barrier layer 24 in order to enhance the electron mobility and reduce the sheet resistance of the field effect transistor device 10.

A source electrode 28 and a drain electrode 30 are formed on the second barrier layer 24, wherein the source electrode 28 and the drain electrode 30 can be spaced apart from each other on the second barrier layer 26 and be formed by the same material and in the same process. The choice of material for the source electrode 28 and the drain electrode 30 is unlimited, and can be any conventional conductive material. A first passivation layer 32 is formed on the second barrier layer 24 covering the source electrode 28 and the drain electrode 30. Further, the recess 26 passes through the second barrier layer 24 and the first passivation layer 32. The first passivation layer 32 can be an oxide layer, such as a silicon oxide layer. An insulating layer 34 is conformally formed on the first passivation layer 32 covering the sidewalls and a bottom surface of the recess 26. A ate electrode 36 (such as Schottky electrode) is filled into the recess 26. For example, the insulating layer 34 can be aluminum oxide layer and the gate, for reducing gate leakage current and increasing breakdown voltage of the gate electrode 36. The choice of material for the gate electrode 36 is unlimited, and can be any conventional conductive material. In order to achieve a device with high current, a source contact 40 and a drain contact 42 can further be formed to electrically connect to the source electrode 20 and the drain electrode 30 for parallel connection of a plurality of field effect transistors. Accordingly, the field effect transistor device 10 of the invention can have an electron mobility of larger than 800 cm²/Vs.

The invention also provides a method for manufacturing the aforementioned field effect transistor device 10.

Figure 2A:
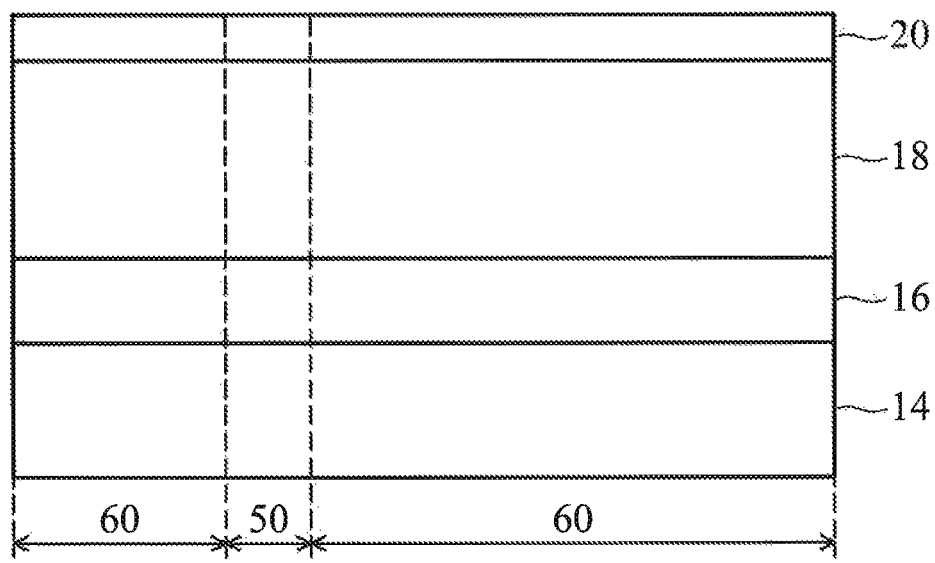
FIGS. 2a-2f are cross sections showing a method for manufacturing a field effect transistor device as shown in FIG. 1.

First, as shown in FIG. 2a, a substrate 14 (such as a sapphire) having a gate-located region 50 and an access region 60 is provided, and a buffer layer 16 (such as a composite layer of $Al_wGa_{(1-w)}N/AlN$, $0 \le w \le 0.5$), a channel layer 18 (such as a GaN layer), and a first barrier layer 20 (such as a $Al_xGa_{(1-x)}N$ layer, $0 \le x \le 0.5$) are sequentially formed on the substrate. The method for forming the buffer layer 16, the channel layer 18, and the first barrier layer 20 can be metal-organic chemical vapor deposition (MOCVD).

Figure 2B:
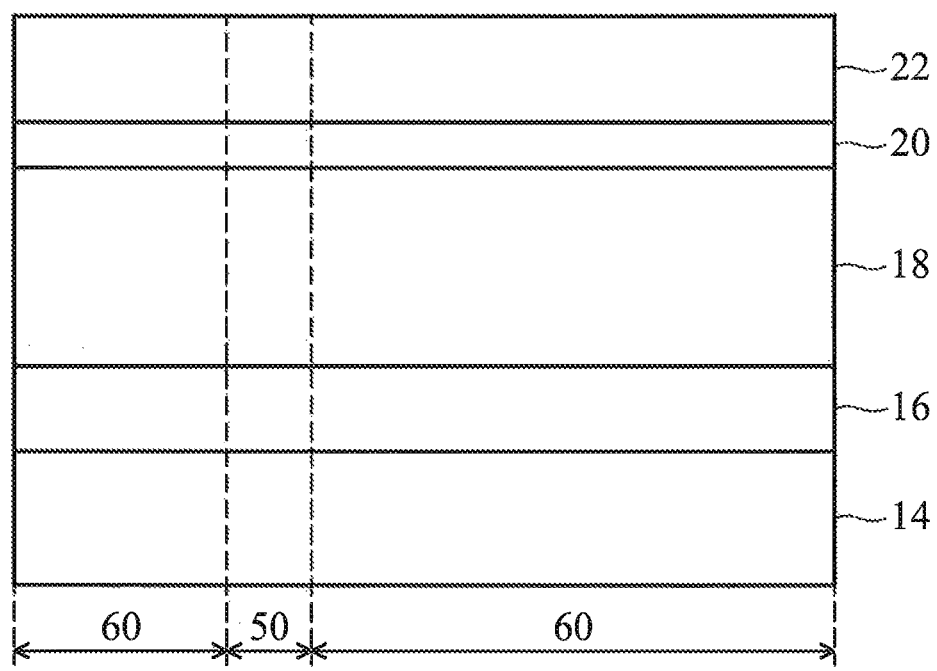
Figure 3:
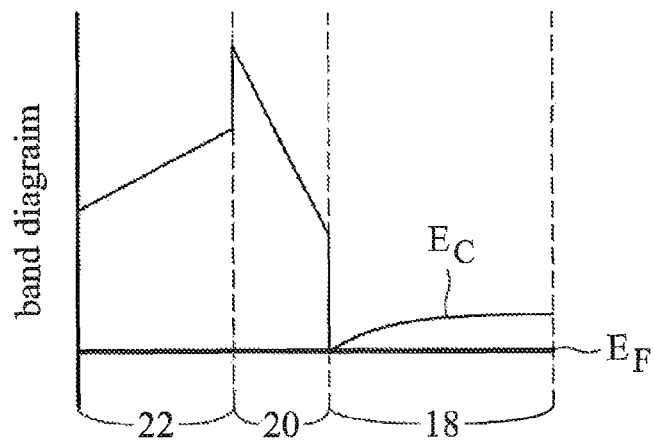
FIG. 3 is a simulated band diagram of the structure as shown in FIG. 2b.

Next, as shown in FIG. 2b, a two-dimensional electron gas controlling layer 22 (such as a GaN layer) is formed on the first barrier layer 20, wherein the two-dimensional electron gas controlling layer 22 has a thickness of more than or equal to 5 nm, such as 20 nm. Please refer to FIG. 3, the band diagram (simulated by ID Poisson (a program for calculating energy band diagrams for semiconductor))/channel layer (GaN)/first barrier layer ($Al_xGa_{(1-x)}N/AlN$, $(0 \le x \le 0.5)$)/two-dimensional electron gas controlling layer(GaN)) of FIG. 2b is shown. Since the two-dimensional electron gas controlling layer 22 has a thickness which is large enough to increase the energy band for the conduction band $E_C$ electrons within a gate-located region 50 (as shown in FIG. 1), the distance between the conduction band $E_C$ and the Fermi level $E_F$ is a positive value or zero and there is no two-dimensional electron gas concentration which is observed at the channel layer 20. Therefore, a field effect transistor being capable of operating as a normally-off switch can be achieved due to the two-dimensional electron gas controlling layer 22.

Figure 2C:
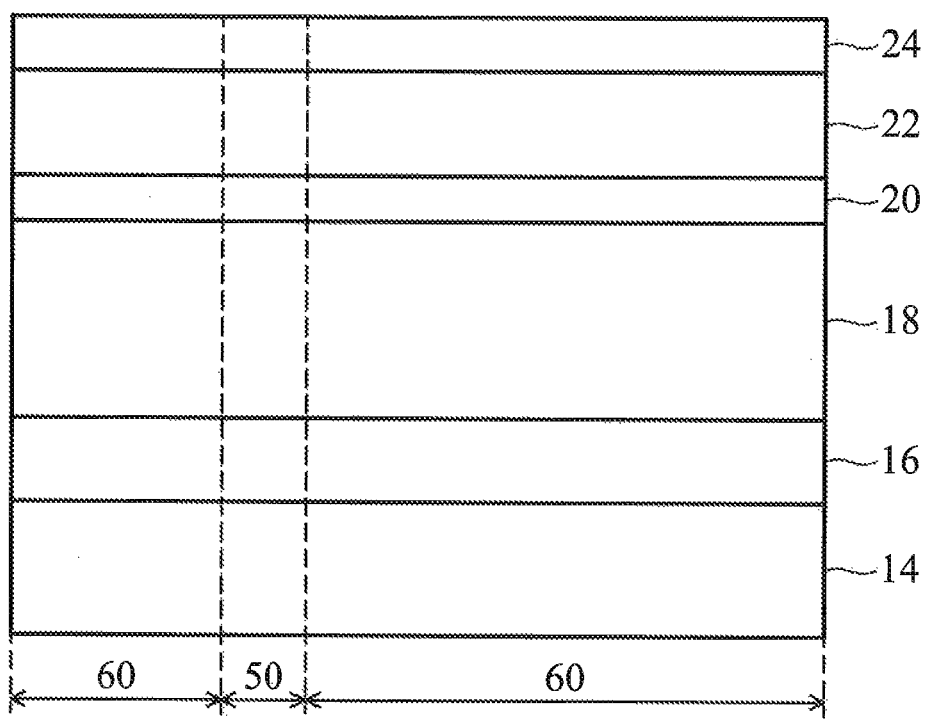
Figure 4:
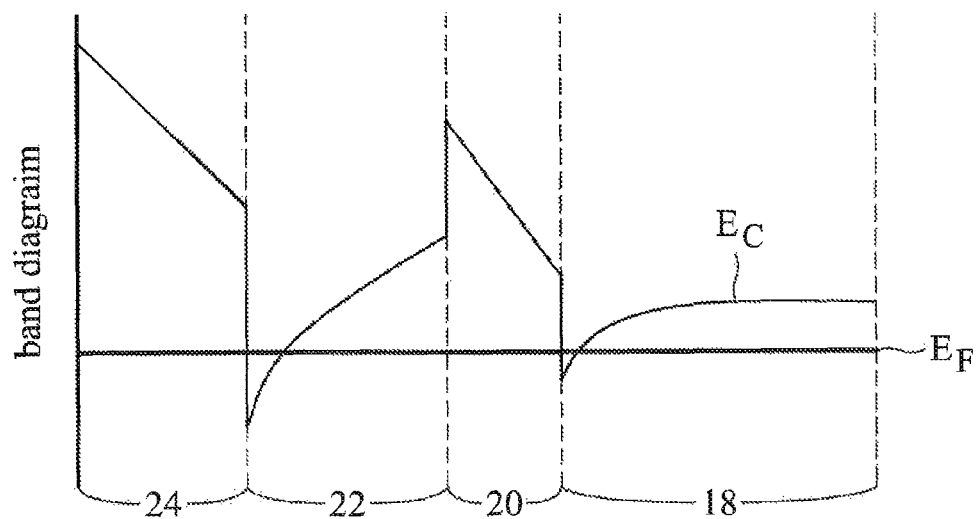
FIG. 4 is a simulated band diagram of the structure as shown in FIG. 2c.

Next, as shown in FIG. 2c, a second barrier layer 24 is formed on the two-dimensional electron gas controlling layer 22. The second barrier layer 24 comprises AlInN. In an embodiment of the invention, the second barrier layer is made of $Al_hIn_{(1-h)}N$, $0.8 \le h \le 1$. Since aluminum indium nitride has high spontaneous polarization, the second barrier layer 24 made of aluminum indium nitride can be capable to prevent electrons from escaping from the two-dimensional electron gas controlling layer 22, thereby forcing the two-dimensional electron gas controlling layer 22 to function as a second channel (the channel layer is the first channel). Please refer to FIG. 4, the band diagram (simulated by 1D Poisson (a program for calculating energy band diagrams for semiconductor structures)) of the structure (substrate 14 (sapphire)/buffer layer ($Al_xGa_{(1-x)}N/AlN$, $(0 \le x \le 0.5)$)/channel layer (GaN)/first barrier layer ($Al_xGa_{(1-x)}N/AlN$, $(0 \le x \le 0.5)$)/two-dimensional electron gas controlling layer (GaN)/second barrier layer ($Al_hIn_{(1-h)}N$, $0.8 \le h \le 1$) of FIG. 2c is shown. Due to the spontaneous polarization of the second barrier layer 24, the conduction band $E_C$ crosses the Fermi level ($E_F$) at the two-dimensional electron gas controlling layer 22 and the channel layer 18, indicating that the two-dimensional electron gas controlling layer 22 and the channel layer 18 both have two-dimensional electron gas concentrations, wherein the two-dimensional electron gas concentration at the channel layer 18 is enhanced by means of the second barrier layer 24. Therefore, the field effect transistor device 10 of the invention can have a double-channel configuration. As shown in FIG. 4, the channel layer 18 has a first two-dimensional electron gas concentration and the two-dimensional electron gas controlling layer has a second two-dimensional electron gas concentration, wherein the second two-dimensional electron gas concentration is larger than the first two-dimensional electron gas concentration.

Figure 2D:
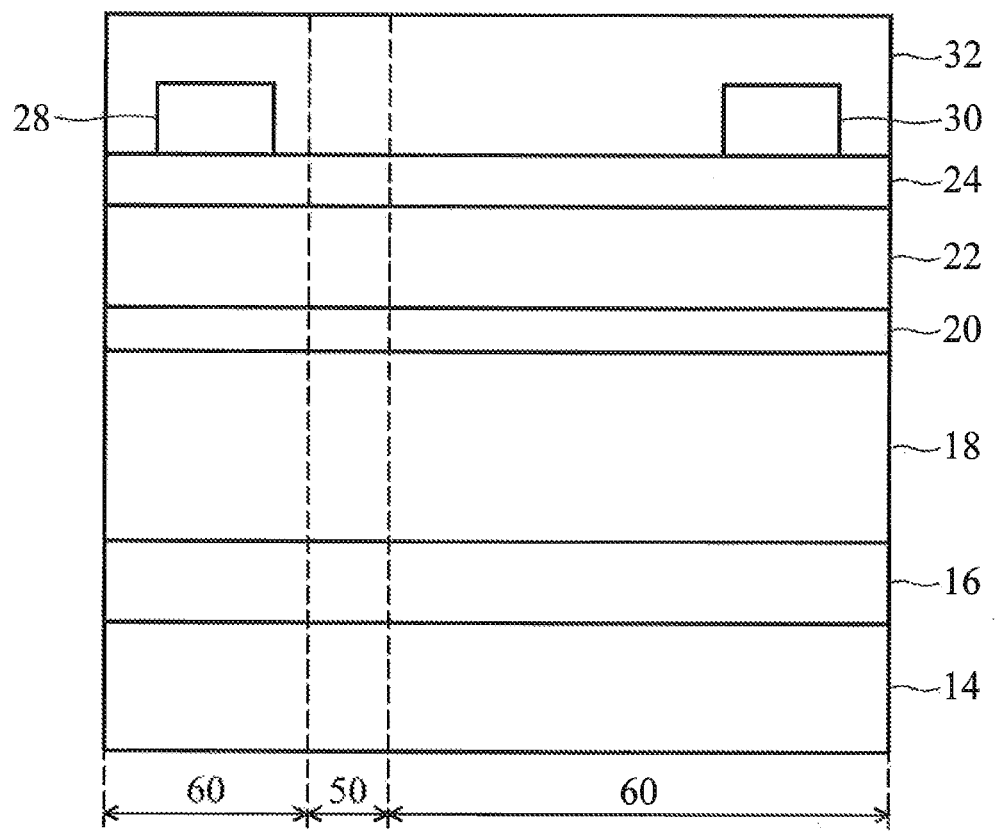

Next, as shown in FIG. 2d, a source electrode 28 and a drain electrode 30 are formed on the second barrier layer 24, wherein the source electrode 28 and the drain electrode 30 can be formed by the same material and in the same process. The choice of material for the source electrode 28 and the drain electrode 30 is unlimited, and can be any conventional conductive materials. A first passivation layer 32 is formed on the second barrier layer 24 covering the source electrode 28 and the drain electrode 30.

Figure 2E:
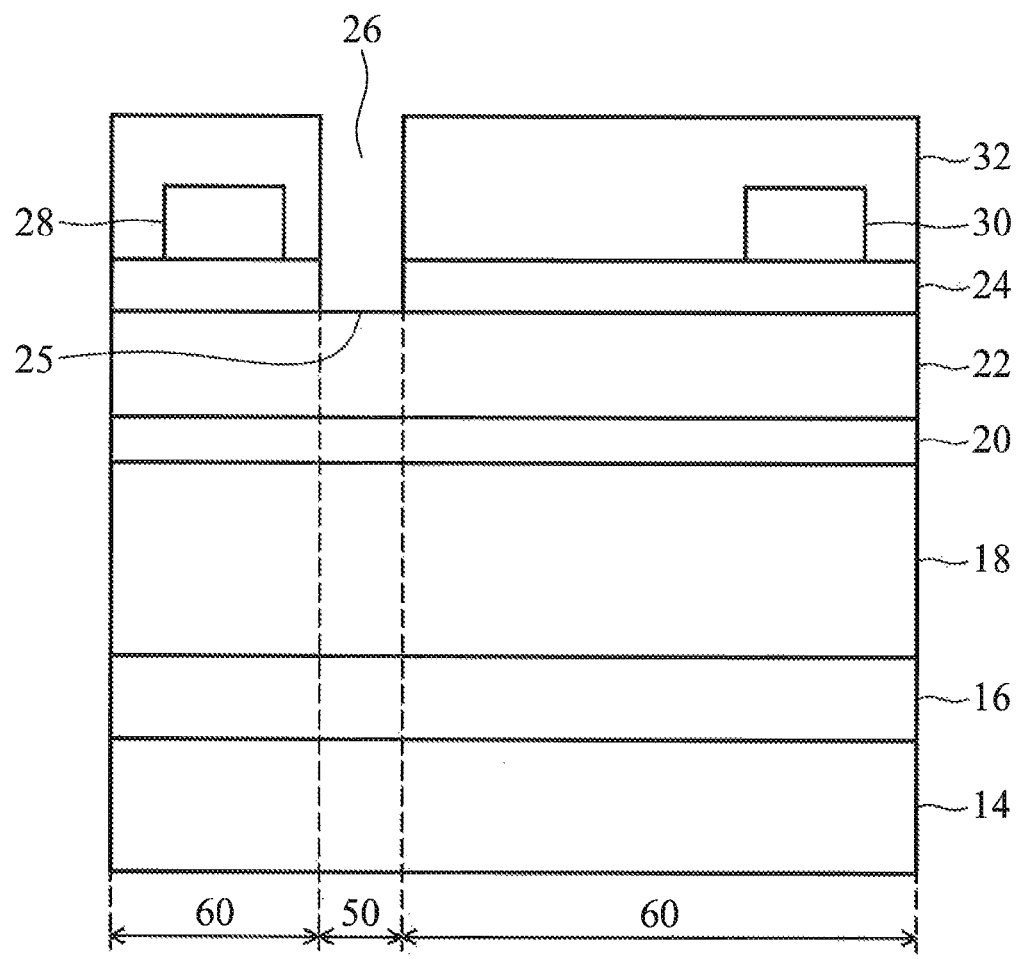

Next, as shown in FIG. 2e, the first passivation layer 32 and the second barrier layer 24 is patterned to remove the first passivation layer 32 and the second barrier layer 24 within the gate-located region 50, forming a recess 26 via an etching process. Herein, since the second barrier layer 24 has a high aluminum content, when the two-dimensional electron gas controlling layer is made of GaN, the second barrier layer 24 can be patterned by a wet-etching processing an alkaline solution as etchant) with the two-dimensional electron gas controlling layer 22 functioning as an etching stop layer. Due to the high etching selectivity between the aluminum indium nitride and gallium nitride, the etching depth of the recess can be controlled accurately to expose the top surface 25 of the two-dimensional electron gas controlling layer 22 without removing or damaging the two-dimensional electron gas controlling layer 22.

Figure 2F:
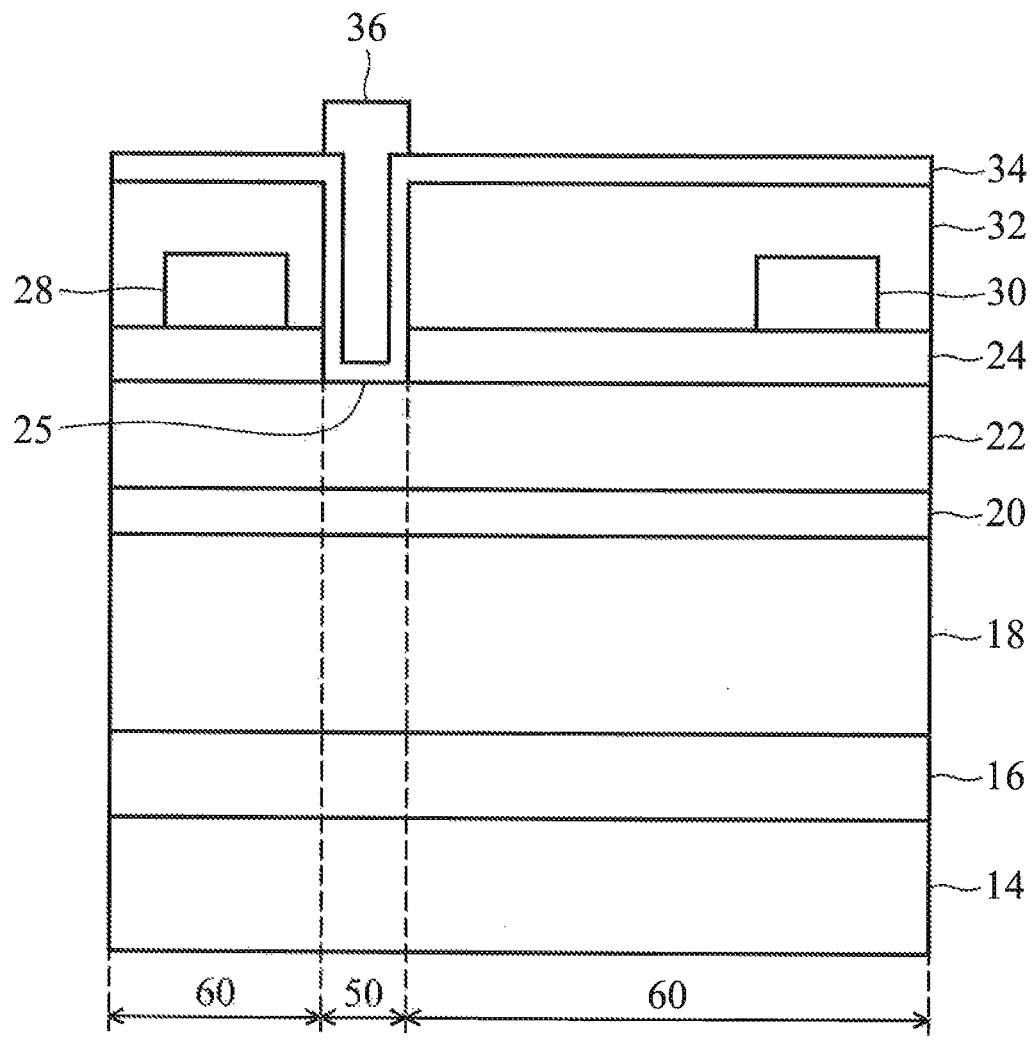

Next, as shown in FIG. 2f, an insulating layer (aluminum oxide) is conformally formed on the first passivation layer 32 and filled into the recess 26, covering sidewalls and a bottom surface of the recess. The method for forming the insulating layer can be atomic layer deposition (ALD) for reducing gate leakage current and increasing breakdown voltage of the gate electrode 36. Next, a gate electrode 36 is filled into the recess 26. Since the second barrier 24 (directly under the gate electrode 36) within the gate-located region 50 is completely removed, there is no two-dimensional electron gas generated at the two-dimensional electron gas controlling layer directly under the gate electrode 36, resulting in the obtained field effect transistor device being capable of operating as a normally-off switch.

Finally, a patterned second passivation layer 38 is formed on the first passivation layer 36, and a source contact 40 and a drain contact 42 is further formed to electrically connect to the source electrode 28 and the drain electrode 30 respectively, obtaining the field effect transistor device 10 as shown in FIG. 1.

Figure 5A:
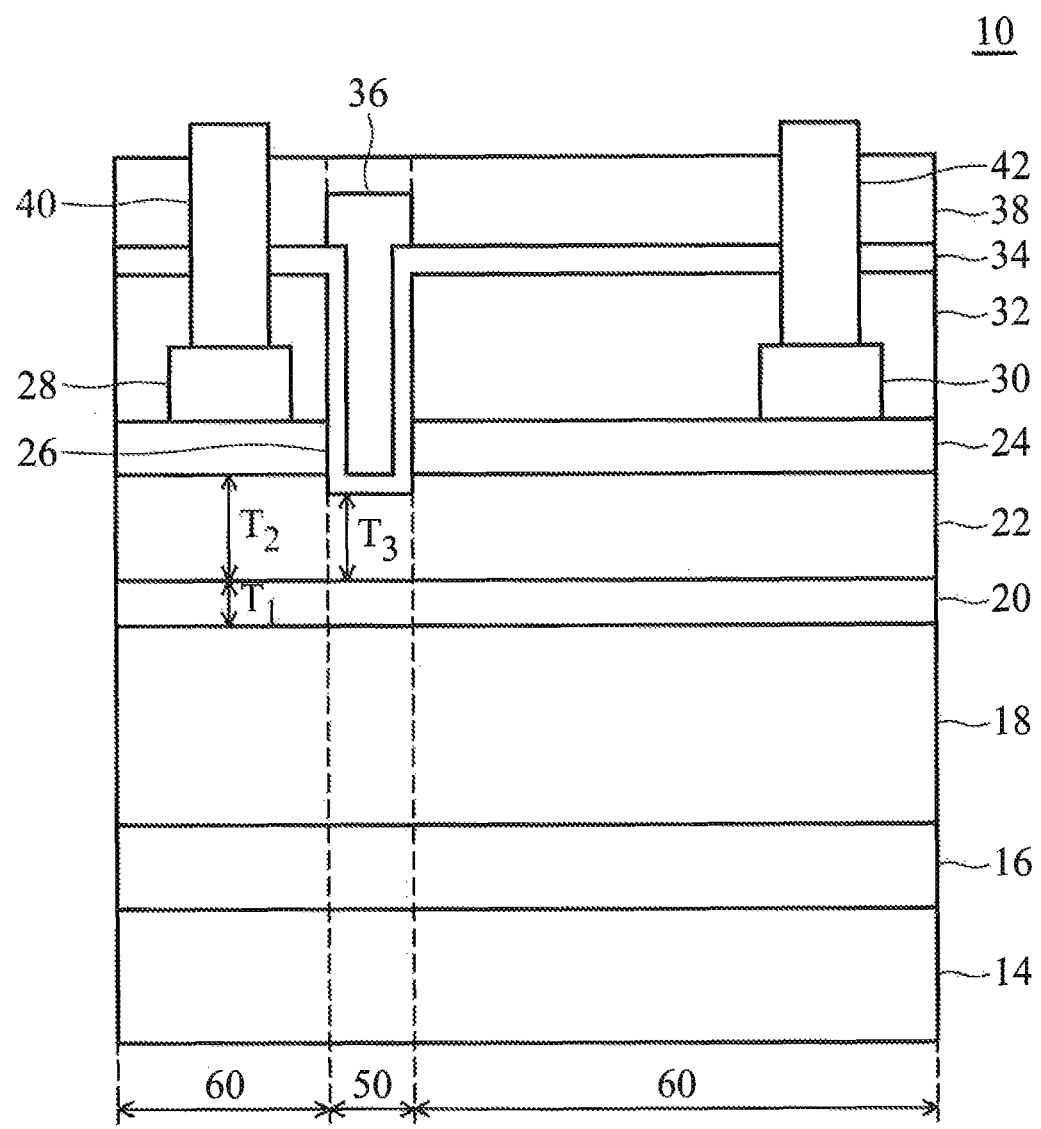
FIGS. 5A and 5B is a cross-section showing a field effect transistor device according to some embodiment of the invention.
Figure 5B:
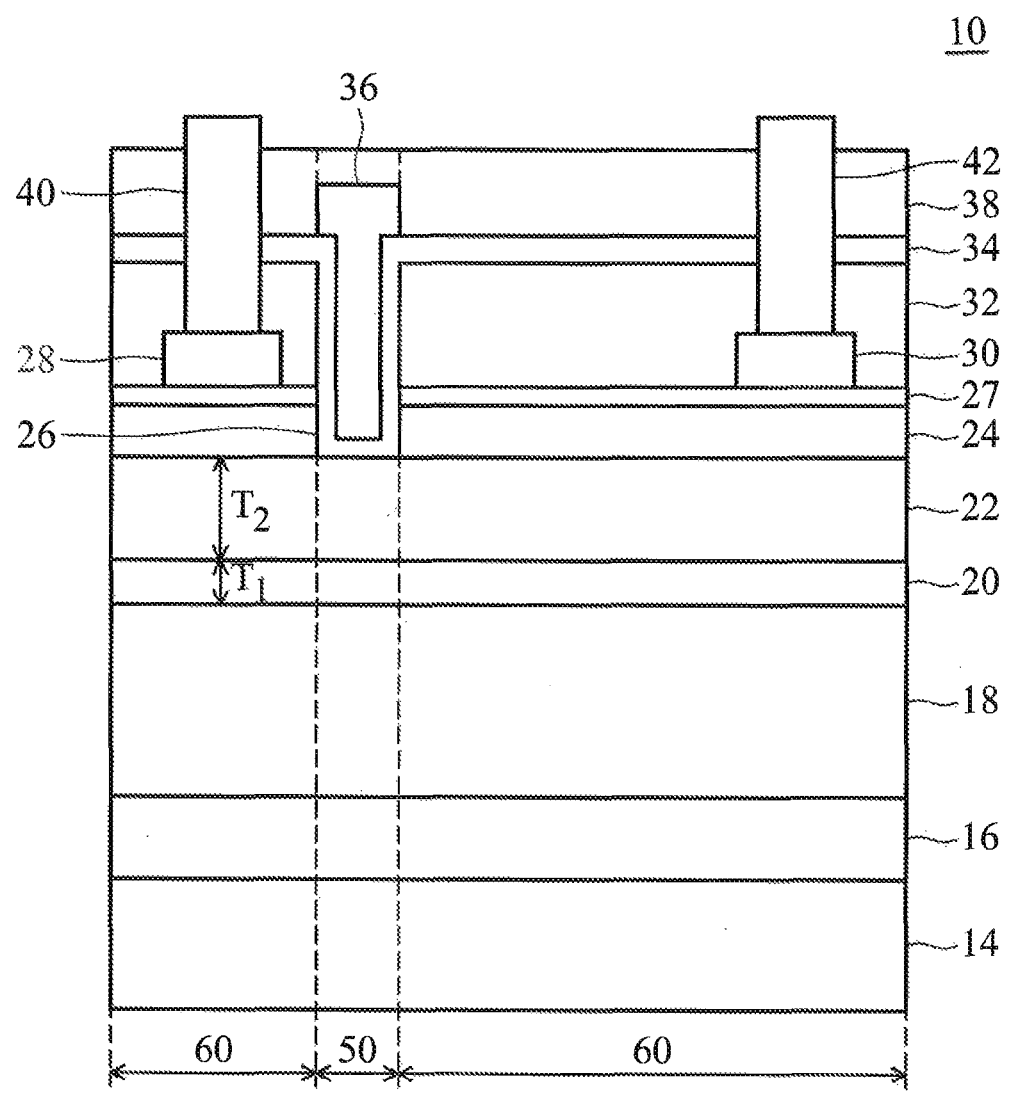

According to another embodiment of the invention, after forming the structure as shown in FIG. 2d, the etching process for patterning the first passivation layer 32 and the second barrier layer 24 can be a dry-etching process, when the two-dimensional electron gas controlling layer is made of $Al_zGa_{(1-z)}N$, wherein z is larger than 0 and smaller than 0.5. In the dry-etching process, the two-dimensional electron gas controlling layer functions as an etching buffer layer. It should be noted that, as shown in FIG. 5A, the thickness of the two-dimensional electron gas controlling layer $T_2$ must be thick enough to force the two-dimensional electron gas controlling layer within the gate-located region 50 having a thickness $T_3$ (the distance between the bottom of the recess and the top surface of the first barrier layer 20) of equal to or more than 5 nm. Namely, the thickness $T_2$ of the dimensional electron gas controlling layer must be larger than 5 nm to ensure that there is no generation of two-dimensional electron gas at the two-dimensional electron gas controlling layer 22 within the gate-located region 50. Therefore, the field effect transistor device 10 as shown in FIG. 5A can be capable of operating as a normally-off switch. In an embodiment of the invention, the field transistor device 10 further comprises a cap layer 27 comprising GaN disposed on the second barrier layer 24 as shown in FIG. 5B. The GaN cap layer 27 could not only prevent the second barrier layer 24 from oxidation but also raise the band diagram of the second barrier layer 24 to reduce leakage current of the devices.

Please refer to Table 1, showing the practical field effect transistor devices (I)-(III) of the invention. The materials of each layer of the practical field effect transistor devices (I)-(III) are shown in Table 1.

TABLE 1

|  | field effect transistor devices (I) | field effect transistor devices (II) | field effect transistor devices (III) |
| --- | --- | --- | --- |
| Buffer layer (500 nm) | AlN | AlN | AlN |
| Channel layer (500 nm) | GaN | $Al_{0.1}Ga_{0.9}N$ | $Al_{0.2}Ga_{0.8}N$ |
| First barrier layer (5 nm) | $Al_{0.23}Ga_{0.77}N$ | $Al_{0.23}Ga_{0.77}N$ | $Al_{0.5}Ga_{0.5}N$ |
| Two-dimensional electron gas controlling layer (20 nm) | GaN | $Al_{0.1}Ga_{0.9}N$ | $Al_{0.2}Ga_{0.8}N$ |
| Second barrier layer (10 nm) | $Al_{0.8}In_{0.2}N$ | $Al_{0.8}In_{0.2}N$ | $Al_{0.8}In_{0.2}N$ |

Figure 6:
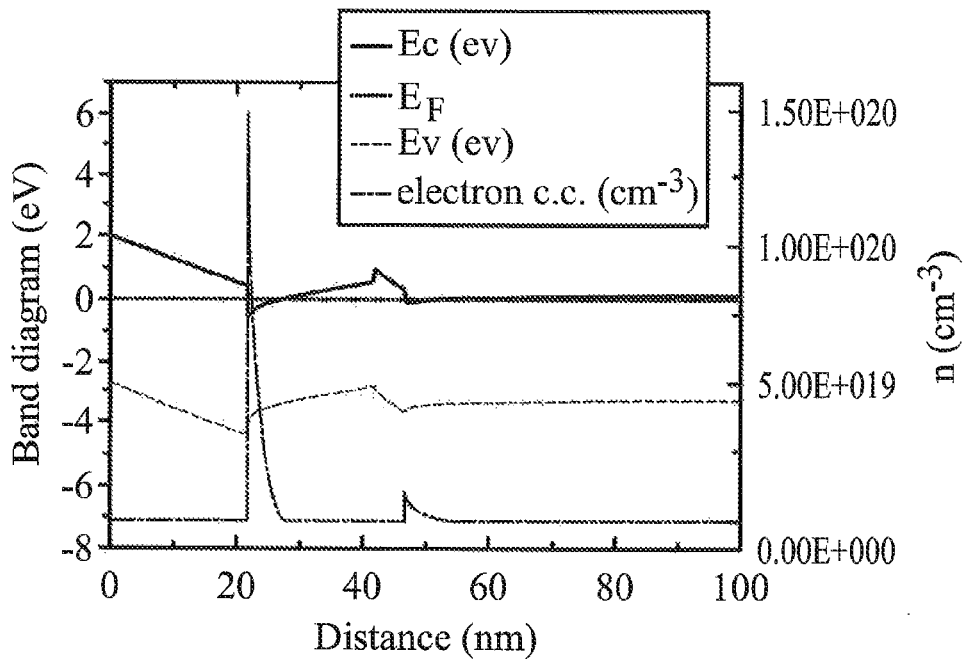
FIGS. 6, 8 and 10 are band diagrams under the access region of the field effect transistor devices (I)-(III) respectively.
Figure 7:
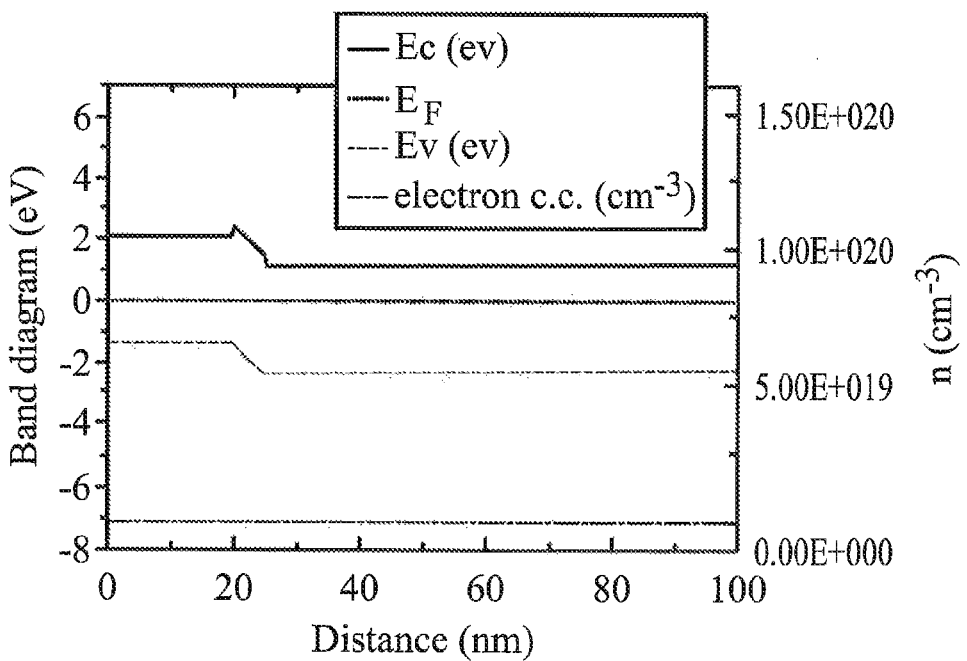
FIGS. 7, 9, and 11 are band diagrams under the gate-located region of the field effect transistor devices (I)-(III) respectively.
Figure 8:
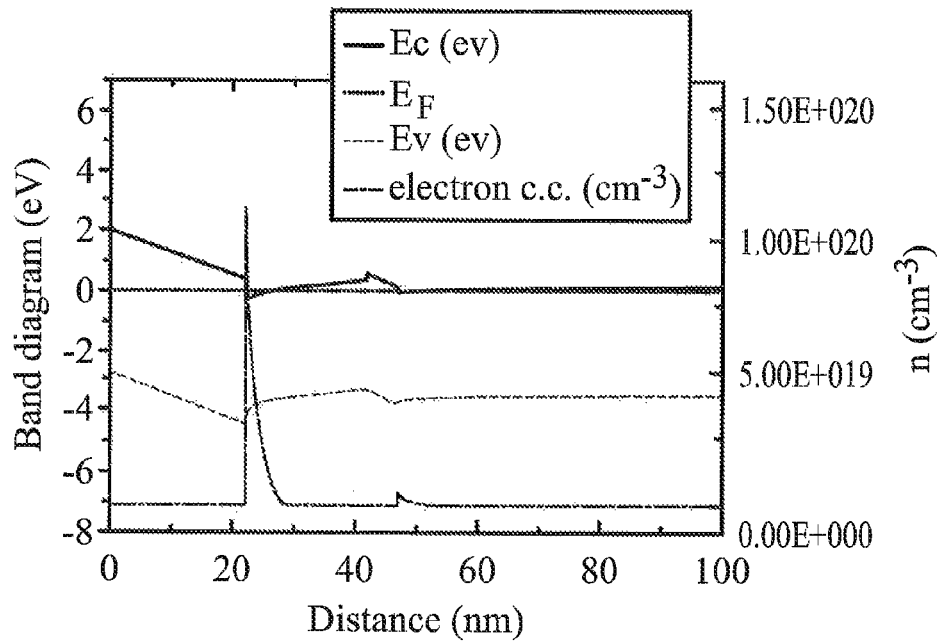
Figure 9:
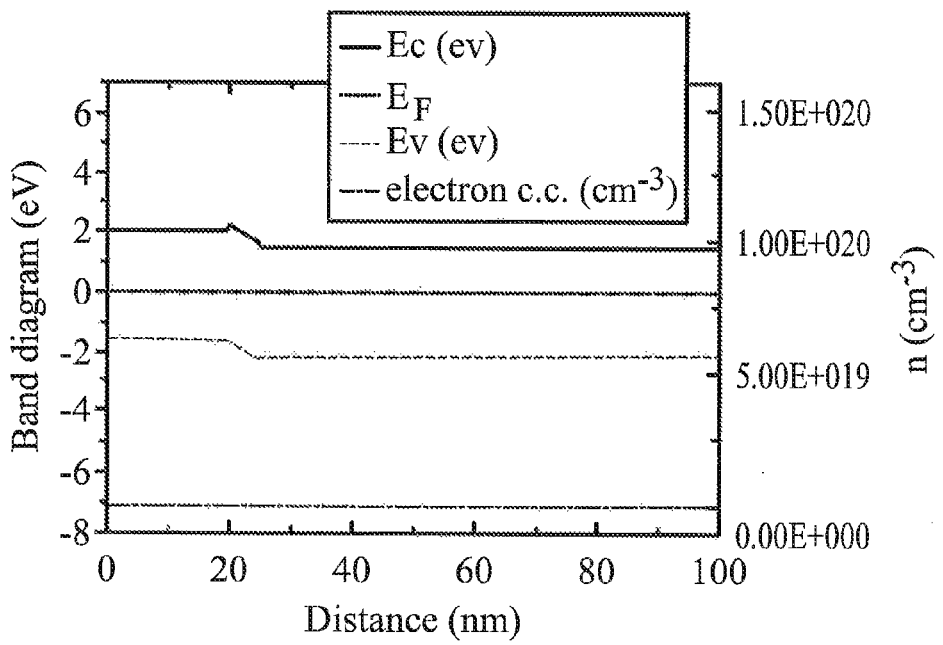
Figure 10:
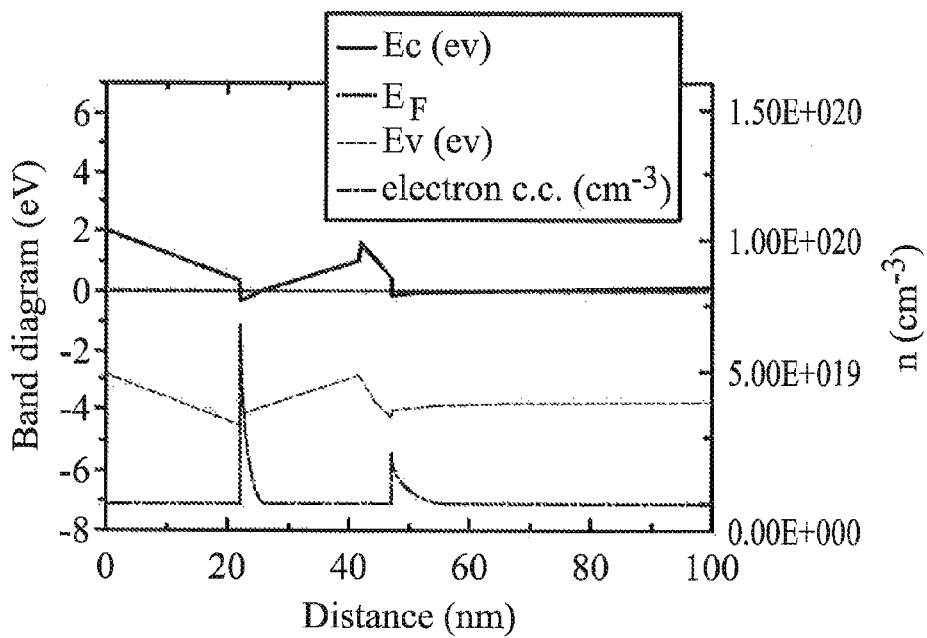
Figure 11:
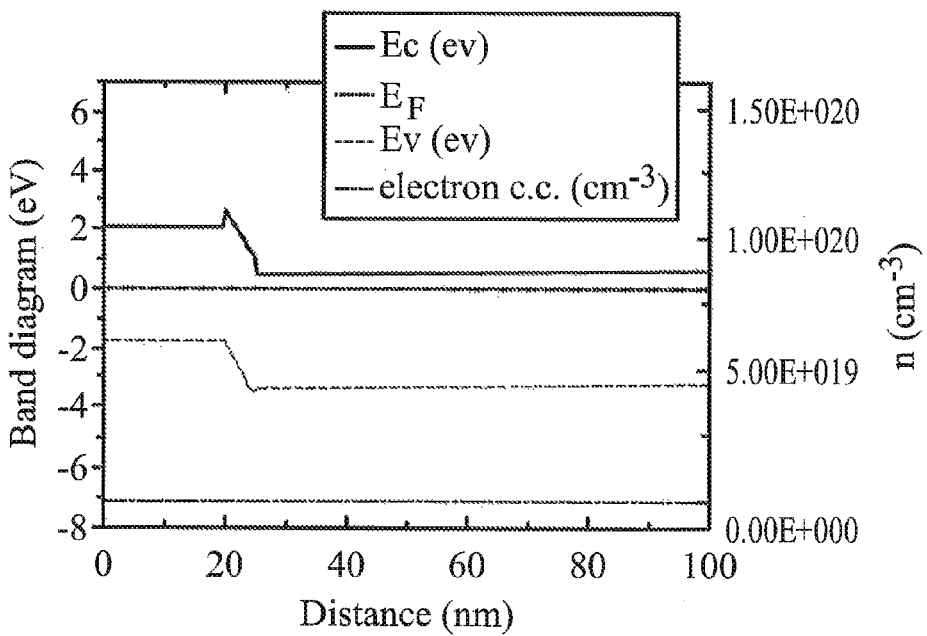

FIGS. 6, 8, and 10 show the band diagram under the access region of the field effect transistor devices (I)-(III) respectively. Accordingly, the conduction band $E_C$ crosses the Fermi level $E_F$ at the channel layer (first channel) and the two-dimensional electron gas controlling layer (second channel), and the channel layer has a first two-dimensional electron gas concentration and the two-dimensional electron gas controlling layer has a second two-dimensional electron gas concentration, wherein the second two-dimensional electron gas concentration is larger than the first two-dimensional electron gas concentration. Further, FIGS. 7, 9, and 11 show the band diagram under the gate-located region of the field effect transistor devices (I)-(III) respectively, showing the conduction band $E_C$ and valence band $E_V$ with respect to the Fermi level $E_F$. In the band diagrams, the minimum distance between the conduction band $E_C$ and the Fermi level $E_F$ at zero bias on the gate defines the device's internal barrier. Therefore, the field effect transistor devices (I)-(III) is capable of operating as a normally-off switch.

From the above discussion, the field effect transistor device of the invention has the following advantages.

First, the channel layer and the two-dimensional electron gas controlling layer can have two-dimensional electron gas concentration (as shown in FIGS. 6, 8, and 10) due to the spontaneous polarization of the first and second barrier layer. Therefore, the field effect transistor device of the invention has a double-channel configuration. Further, as shown in FIGS. 6, 8, and 10, since the two-dimensional electron gas controlling layer has a two-dimensional electron gas concentration larger than that of the channel layer, the forward biased access of the field effect transistor device is enhanced.

Second, the second barrier layer within the gate-located region can be removed by dry or wet etching with the two-dimensional electron gas controlling layer functioning as an etching stop or a etch buffer. Particularly, when the second barrier layer is made of $Al_h In_{(1-h)}N$ (0.8≤h≤1) and the two-dimensional electron gas controlling layer is made of GaN, the recess can be formed via a wet etching process and the etching depth of the recess can be controlled accurately to expose the top surface of the two-dimensional electron gas controlling layer without removing or damaging the two-dimensional electron gas controlling layer, due to the high etching selectivity between the aluminum indium nitride and gallium nitride. Therefore, the field effect transistor device (such as a heterojunction field effect transistor) with a uniform threshold voltage and high reliability can be provided.

Third, since the second barrier layer directly wider the gate electrode is removed, there is no two-dimensional electron gas concentration which has been observed at the two-dimensional electron gas controlling layer and the channel layer directly under the gate electrode, as shown in FIGS. 7, 9, and 11. Therefore, a field effect transistor capable of operating as a normally-off switch can be achieved. Further, since there is a channel layer directly under the two-dimensional electron gas controlling layer, the structure of the first barrier layer/channel layer directly under the gate electrode can function as an interface with high electron mobility, when applying a positive basis to the gate electrode. Therefore, the problem of high resistance due to the structure of metal (gate electrode)/insulating layer/semiconductor layer (MIS) can be solved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A field effect transistor device, comprising:
   a substrate;
   a buffer layer, a channel layer, and a first barrier layer sequentially disposed on the substrate;
   a two-dimensional electron gas controlling layer disposed on the first barrier layer, wherein the two-dimensional electron gas controlling layer has a thickness of more than or equal to 5 nm;
   a second barrier layer disposed on the two-dimensional electron gas controlling layer, wherein the second barrier layer has a recess passing through the second barrier layer; and
   a gate electrode filled into the recess and separated from the second barrier layer and the two-dimensional electron gas controlling layer by an insulating layer.

2. The field effect transistor device as claimed in claim 1, further comprising:
   a source electrode and a drain electrode disposed to be spaced apart from each other on the second barrier layer.

3. The field effect transistor device as claimed in claim 1, wherein the channel layer is made of $Al_x Ga_{(1-x)}N$, and x is of between 0-0.5.

4. The field effect transistor device as claimed in claim 3, wherein the first barrier layer is made of $Al_y Ga_{(1-y)}N$, and y is of between 0.05-0.5, wherein y is larger than x.

5. The field effect transistor device as claimed in claim 4, wherein the two-dimensional electron gas controlling layer is made of $Al_z Ga_{(1-z)}N$, z is of between 0-0.5, wherein y is larger than z.

6. The field effect transistor device as claimed in claim 1, wherein the second barrier layer comprises AlInN.

7. The field effect transistor device as claimed in claim 1, wherein the second barrier layer is made of $Al_h In_{(1-h)}N$, and h is of between 0.8-1.

8. The field effect transistor device as claimed in claim 7, wherein the recess exposes a top surface of the two-dimensional electron gas controlling layer.

9. The field effect transistor device as claimed in claim 1, further comprising a cap layer disposed on the second barrier layer.

10. The field effect transistor device as claimed in claim 1, wherein the recess passes through the second barrier layer and a part of the two-dimensional electron gas controlling layer, and a minimum distance between a bottom surface of the recess and a bottom surface of the two-dimensional electron gas controlling layer is larger than or equal to 5 nm.

11. The field effect transistor device as claimed in claim 1, wherein the channel layer has a first two-dimensional electron gas concentration and the two-dimensional electron gas controlling layer has a second two-dimensional electron gas concentration, wherein the second two-dimensional electron gas concentration is larger than the first two-dimensional electron gas concentration.

12. The field effect transistor device as claimed in claim 1, wherein the field effect transistor device is capable of operating as a normally-off switch.

13. The field effect transistor device as claimed in claim 1, wherein the second barrier layer has an energy gap larger than the channel layer.

14. The field effect transistor device as claimed in claim 1, wherein the field effect transistor device has a mobility of larger than 800 $cm^2/Vs$.

15. The field effect transistor device as claimed in claim 1, further comprising:
an AlN layer disposed between the two-dimensional electron gas controlling layer and the second barrier layer.

16. A method of manufacturing a field effect transistor device as claimed in claim 1, comprising:
providing a substrate;
sequentially forming a buffer layer, a channel layer, and a first barrier layer sequentially on the substrate;
forming a two-dimensional electron gas controlling layer on the first barrier layer, wherein the two-dimensional electron gas controlling layer has a thickness of more than or equal to 5 nm;
forming a second barrier layer on the two-dimensional electron gas controlling layer;
patterning the second barrier layer to form a recess passing through the second barrier layer; and
forming an insulating layer to cover sidewalls and a bottom surface of the recess, and filling a gate electrode into the recess.

17. The method as claimed in claim 16, wherein the method for patterning the second barrier layer comprises dry etching.

18. The method as claimed in claim 16, wherein the recess passes through the second barrier layer and a part of the two-dimensional electron gas controlling layer, and a minimum distance between a bottom surface of the recess and a bottom surface of the two-dimensional electron gas controlling layer is larger than or equal to 5 nm.

19. The method as claimed in claim 16, wherein the method for patterning the second barrier layer comprises wet etching.

20. A field effect transistor device, comprising:
a substrate;
a channel layer disposed on the substrate;
a first barrier layer disposed on the channel layer, the first barrier layer having a larger band gap than the channel layer;
a two-dimensional electron gas controlling layer disposed on the first barrier layer;
a second barrier layer disposed on the two-dimensional electron gas controlling layer, wherein the second barrier layer comprises AlInN and has a recess passing through the second barrier layer; and
a gate electrode filled disposed in the recess;
wherein the two-dimensional electron gas controlling layer has enough thickness to prevent to two-dimensional electron gases to be generated at the channel layer under the gate electrode.

* * * * *